United States Patent [19]

Mezawa et al.

[11] 4,417,329

[45] Nov. 22, 1983

[54] ACTIVE PULL-UP CIRCUIT

[75] Inventors: Tsutomu Mezawa, Aizuwakamatsu; Katsuhiko Kabashima; Shigeki Nozaki, both of Kawasaki; Yoshihiro Takemae, Yokohama, all of Japan

[73] Assignee: Fujitsu Limited, Kawasaki, Japan

[21] Appl. No.: 287,104

[22] Filed: Jul. 27, 1981

[30] Foreign Application Priority Data

Jul. 29, 1980 [JP] Japan .................................. 55-104123

[51] Int. Cl.³ .......................... G11C 7/00; H03K 5/05; H03K 17/693

[52] U.S. Cl. .................................. 365/203; 307/449; 307/453; 307/481; 307/530; 365/233

[58] Field of Search .................. 307/530, DIG. 3, 449, 307/453, 481, 482, 572, 577, 578, 246, 264, 463, 581–584; 365/233, 198, 204, 203

[56] References Cited

U.S. PATENT DOCUMENTS

| | | | |
|---|---|---|---|
| 4,070,590 | 1/1978 | Ieda et al. ...................... | 365/203 X |
| 4,262,342 | 4/1981 | Tuan .................................. | 365/203 |
| 4,291,392 | 9/1981 | Proebsting ........................ | 365/203 |
| 4,375,600 | 3/1983 | Wu ..................................... | 307/530 |

OTHER PUBLICATIONS

White et al., "A 5V–Only 64K Dynamic RAM," IEEE Int'l Solid–State Circuits Conference, Feb. 15, 1980, pp. 230-231.

Lee et al., "A 80ns 5V–Only Dynamic RAM," IEEE Int'l Solid–State Circuits Conference, Feb. 15, 1979, pp. 142-143.

Primary Examiner—Stanley D. Miller
Assistant Examiner—David R. Hudspeth
Attorney, Agent, or Firm—Staas & Halsey

[57] ABSTRACT

An active pull-up circuit for use in a sense amplifier or the like, comprises an enhancement type MIS transistor, a MIS capacitor controlled by a clock signal, and a depletion type MIS transistor controlled by another clock signal ($\bar{\phi}_2'$). In this circuit, the two clock signals are bilevel signals having potentials which are the same as potentials of two power supplies.

10 Claims, 14 Drawing Figures

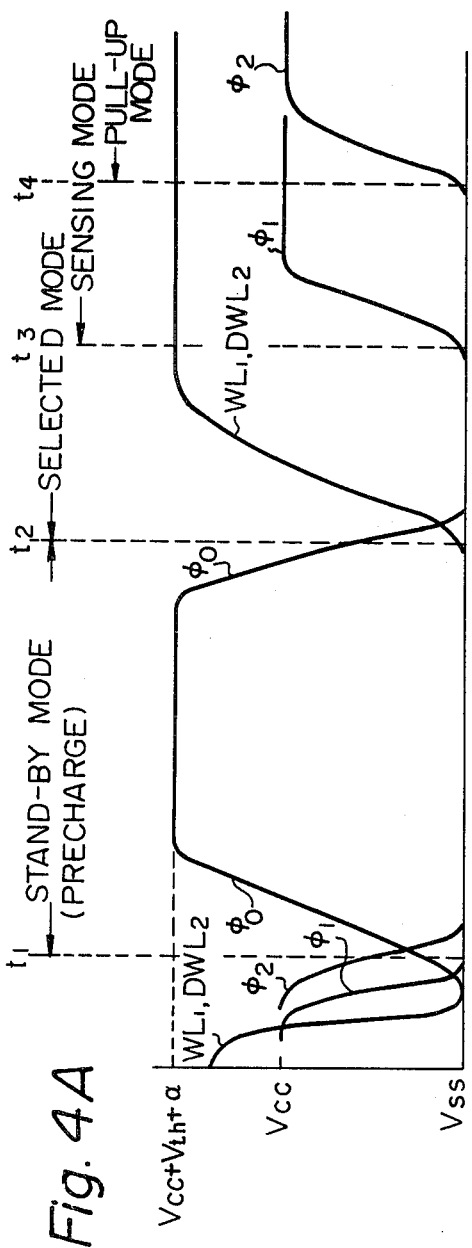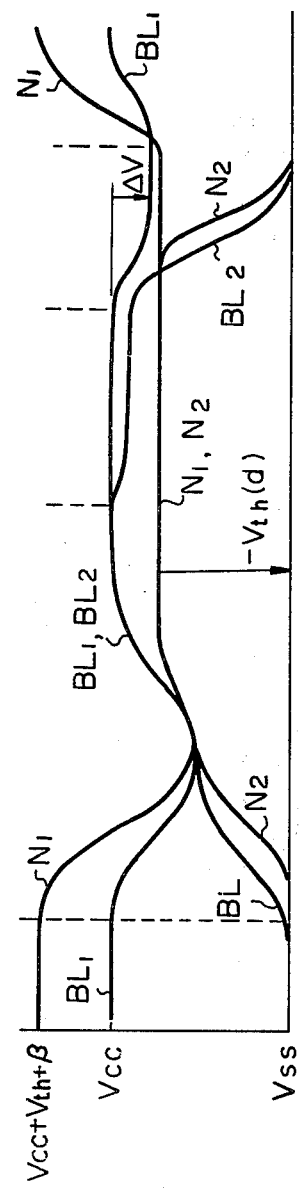
Fig. 4A
Fig. 4B

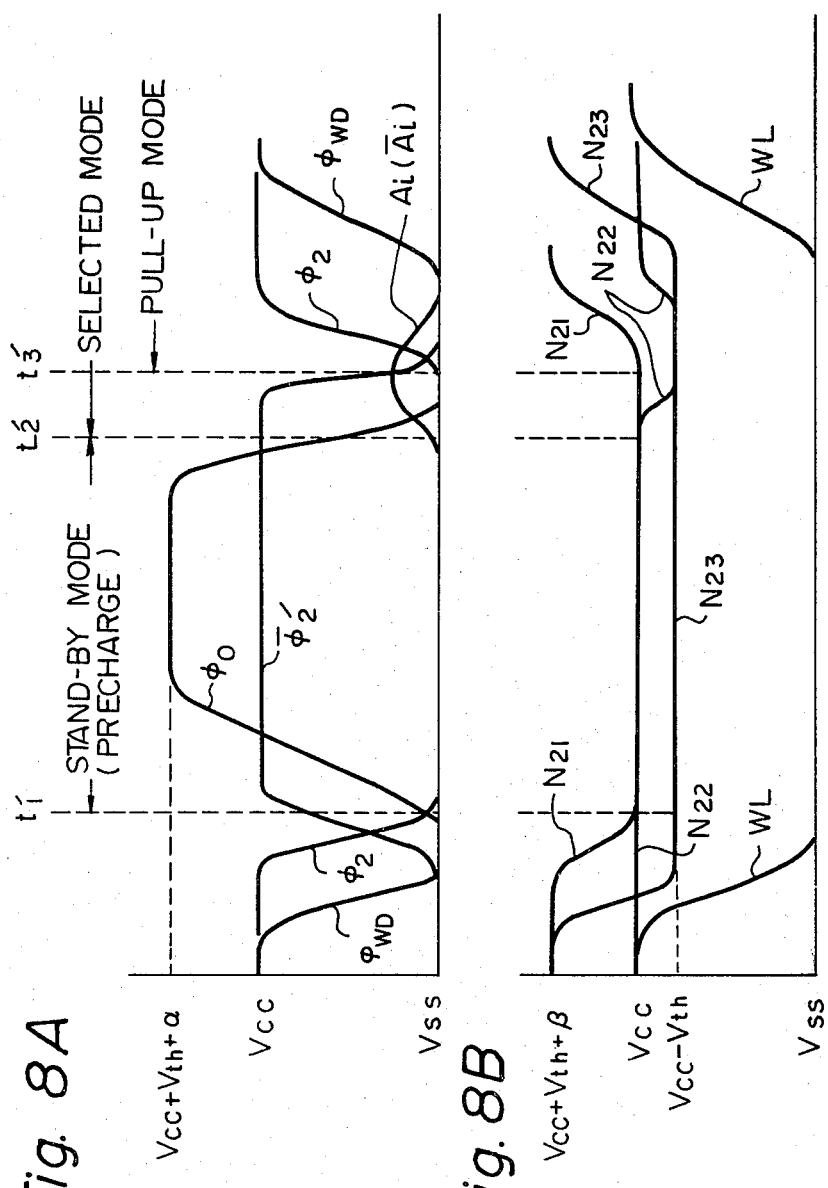

ACTIVE PULL-UP CIRCUIT

BACKGROUND OF THE INVENTION

The present invention relates generally to a MIS (Metal-Insulator-Semiconductor) dynamic random access memory and, more particularly, to an active pull-up circuit for use in a sense amplifier, a word decoder or the like.

In general, a MOS (broadly, MIS) dynamic memory device of a one-transistor and one-capacitor type incorporates memory cells, each comprising a capacitor and an enhancement type transistor which serves as a switching gate for charging or discharging the capacitor. In this case, the presence or absence of charges corresponds to the data "0" or "1." Such memory cells are arranged at intersections between word lines and bit line pairs. In addition, dummy memory cells, which are similar in structure to the memory cells, are arranged at intersections between dummy word lines and the bit line pairs.

In the above-mentioned memory device, a sense amplifier is provided for each bit line pair, in order to read memory information. Therefore, when a memory cell is selected, so that a small difference in potential is generated between the bit line pair connected to the selected memory cell, the sense amplifier senses or enlarges the small difference in potential by pulling down the low-level side potential of the bit line pair. As a result, a large difference in potential is obtained between the bit line pair. This large difference is helpful in the read operation. However, it should be noted that, even in this case, the high-level side potential of the bit line pair is also decreased slightly due to the capacity coupling of the bit line, leak currents and the like, thereby deteriorating the sensing speed of the sense amplifier. To avoid this, the high-level potential is again pulled up by an active pull-up circuit.

A first conventional active pull-up circuit for use in a sense amplifier comprises: a first enhancement type MIS transistor having a drain connected to a power supply ($V_{cc}$) and a source connected to a bit line; a MIS capacitor having an electrode for receiving a first clock signal and another electrode connected to the gate of the first enhancement type transistor; and a second enhancement type MIS transistor having a drain connected to the gate of the first enhancement type transistor, a source connected to the bit line and a gate receiving a second clock signal (See: Digest of Technical Papers of 1980 IEEE International Solid-State Circuits Conference, pp. 230–231, FIG. 1). In this case, the potential of the first clock signal is low ($V_{ss}$) and high ($V_{cc}$) during the stand-by mode and the pull-up mode, respectively. On the other hand, the potential of the second clock signal is high ($>V_{cc}+V_{th}$) and low ($V_{cc}$) during the stand-by mode and the pull-up mode, respectively. Here, $V_{th}$ is a common threshold voltage of the first and second enhancement type transistors.

However, in the above-mentioned first conventional circuit, it is difficult to generate the second clock signal having a high potential which is higher than $V_{cc}+V_{th}$, since another power supply or a bootstrap circuit is required for generating such a high potential.

A second conventional active pull-up circuit comprises a depletion type MIS transistor instead of the second enhancement type MIS transistor of the first conventional circuit. In this case, it should be noted that the gate of the depletion type transistor is connected to a power supply ($V_{ss}$) or to ground (See: Digest of Technical Papers of 1979 IEEE International Solid-State Circuits Conference, pp. 142–143, FIG. 1). Therefore, this circuit has an advantage in that a clock signal whose potential is very high ($>V_{cc}+V_{th}$) is unnecessary.

However, the second conventional circuit has a disadvantage in that a selection range for the negative threshold voltage $V_{th}(d)$ of the depletion type transistor is so small that it is difficult to manufacture a semiconductor device including such active pull-up circuits. This is because the potential of the gate of the first enhancement type transistor is at most $|V_{th}(d)|$ during the stand-by mode, which requires a large bootstrap effect due to the active pull-up circuit and, accordingly, requires a large capacity of the MIS capacitor. Therefore, the value of $|V_{th}(d)|$ is preferably as large as possible. On the other hand, the potential of the high-level bit line prior to the pull-up mode must be higher than $|V_{th}(d)|$, in order to cause the bootstrap effect of the active pull-up circuit. Therefore, the value of $|V_{th}(d)|$ is preferably as small as possible, which is, however, contradictory to the above.

SUMMARY OF THE INVENTION

It is an object of the present invention to provide an active pull-up circuit comprising a depletion type MIS transistor which has a wide selection range.

It is another object of the present invention to provide a dynamic memory device comprising sense amplifiers with such active pull-up circuits.

According to the present invention, there is provided an active pull-up circuit comprising: first and second power supplies, the potential of the first power supply being higher than that of the second power supply; an output line; a first means for generating a first clock signal having a potential which is the same as a second potential level during the stand-by mode, while it is the same as a first potential level, which is higher than the second potential level, during the pull-up mode; a second means for generating a second clock signal having a potential which is the same as a third potential level during the stand-by mode, while it is the same as a fourth potential level, which is lower than the third potential level, during the pull-up mode; means, connected to the first power supply and the output line, for pulling up the potential of the output line; means, connected to the first clock signal generating means and the pulling-up means, for supplying the first clock signal to the pulling-up means; a depletion type MIS transistor having a drain connected to the pulling-up means and the clock signal supplying means, a source connected to the output line and a gate connected to the second clock generating means.

According to the present invention, there is also provided a dynamic memory device comprising: first and second power supplies, the potential of the first power supply being higher than that of the second power supply; a first clock signal generating means for generating a first clock signal having a potential which is high during the stand-by mode; a second clock signal generating means for generating a second clock signal having a potential which is the same as a second potential level during the stand-by mode, while it is the same as a first potential level, which is higher than the second potential level, during the pull-up mode; a third clock signal generating means for generating a third clock signal having a potential which is the same as a third potential level during the stand-by mode, while it is the same as a fourth potential level, which is lower than the third potential level, during the pull-up mode; a plurality of word lines; a plurality of pairs of bit lines; a plurality of memory cells, arranged at intersections between the word lines and the bit lines; a plurality of precharging means, each connected to the first power supply, to the first clock signal generating means and to one of the bit lines, for precharging the bit lines; a plurality of sense amplifiers, each connected between one pair of the bit lines, for sensing the difference in potential between the pair of the bit lines during the sensing mode; a plurality of active pull-up circuits, each connected to the first power supply, to the second and third clock signal generating means and to one of the bit lines, for pulling up the potentials of the bit lines; and wherein each of the active pull-up circuits comprises: a pulling-up means, connected to the first power supply and one of the bit lines, for pulling up the potential of the bit line; a clock signal supplying means, connected to the second clock signal generating means and the pulling-up means, for supplying the second clock signal to the pulling-up means; and a depletion type MIS transistor having a drain connected to the pulling-up means and the clock signal supplying means, a source connected to one of the bit lines and a gate connected to the third clock generating means.

The present invention will be more clearly understood from the following description contrasting the present invention with the conventional circuits and with reference to the accompanying drawings.

BRIEF DESCRIPTION OF THE DRAWINGS

FIGS. 4A and 4B are timing waveform diagrams of the signals appearing in the circuit of FIG. 3;

FIGS. 8A, 8B, 9A and 9B are timing waveform diagrams of the signals appearing in the circuit of FIG. 7.

DESCRIPTION OF THE PREFERRED EMBODIMENTS

Figure 1:
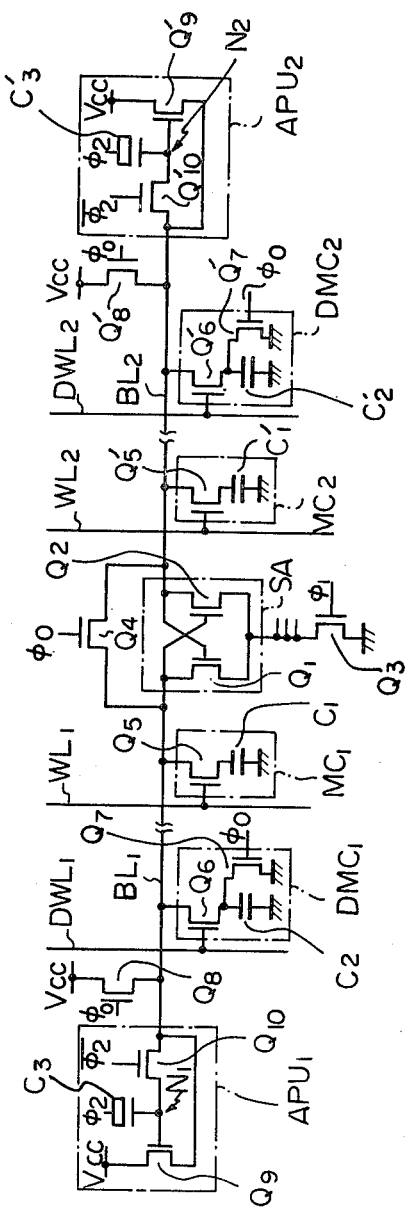
FIG. 1 is a circuit diagram illustrating one conventional dynamic memory device including active pull-up circuits.

In FIG. 1, which illustrates one conventional dynamic memory device including active pull-up circuits (Ref.: the above-mentioned Digest of Technical Papers of 1980 IEEE International Solid-State Circuits Conference), a sense amplifier SA formed by cross-coupled transistors $Q_1$ and $Q_2$ is connected to one pair of bit lines $BL_1$ and $BL_2$. The sense amplifier SA is activated by a transistor $Q_3$ which is also common to other sense amplifiers (not shown). A transistor $Q_4$ is used for equalizing the potentials of the pair of the bit lines $BL_1$ and $BL_2$ during the stand-by mode (during the precharge mode).

At intersections between the word lines $WL_1$ and $WL_2$ and the bit lines $BL_1$ and $BL_2$, memory cells $MC_1$ and $MC_2$ which are of the one-transistor and one-capacitor type, are provided. In this case, the memory cell $MC_1$ (or $MC_2$) is comprised of a transistor $Q_5$ (or $Q_5'$) and a capacitor $C_1$ (or $C_1'$). On the other hand, at intersections between the dummy word lines $DWL_1$ and $DWL_2$ and the bit lines $BL_1$ and $BL_2$, a dummy memory cells $DMC_1$ and $DMC_2$ are provided. In this case, the dummy memory cell $DMC_1$ (or $DMC_2$) is comprised of a transistor $Q_6$ (or $Q_6'$), a capacitor $C_2$ (or $C_2'$) whose capacity is about half of that of the capacitor $C_1$ (or $C_1'$), and a transistor $Q_7$ (or $Q_7'$). In addition, transistors $Q_8$ and $Q_8'$ are used for precharging the bit lines $BL_1$ and $BL_2$, respectively, during the stand-by mode. Further, active pull-up circuits $APU_1$ and $APU_{2l}$ are connected to the terminals of the bit lines $BL_1$ and $BL_2$, respectively.

The active pull-up circuit $APU_1$ (or $APU_2$) comprises an enhancement type transistor $Q_9$ (or $Q_9'$) having a drain connected to a power supply $V_{cc}$ which is, for example, 5 volts, a source connected to the bit line $BL_1$ (or $BL_2$) and a gate connected to a node $N_1$ (or $N_2$); a MOS capacitor $C_3$ (or $C_3'$) having an electrode connected to the node $N_1$ (or $N_2$) and having another electrode which receives a clock signal $\phi_2$; and an enhancement type transistor $Q_{10}$ (or $Q_{10}'$) having a drain connected to the node $N_1$ (or $N_2$), a source connected to the bit line $BL_1$ (or $BL_2$) and a gate which receives a clock signal $\overline{\phi}_2$. In this case, the potential of the clock signal $\phi_2$ is low ($V_{ss}=0$ volt) and high ($V_{cc}$) during the stand-by mode and the pull-up mode, respectively. On the other hand, the potential of the clock signal $\overline{\phi}_2$ is high ($>V_{cc}+V_{th}$) and low ($V_{cc}$) during the stand-by mode and the pull-up mode, respectively. (Here, $V_{th}$ is a common threshold voltage of the enhancement transistors.)

Figure 2A:
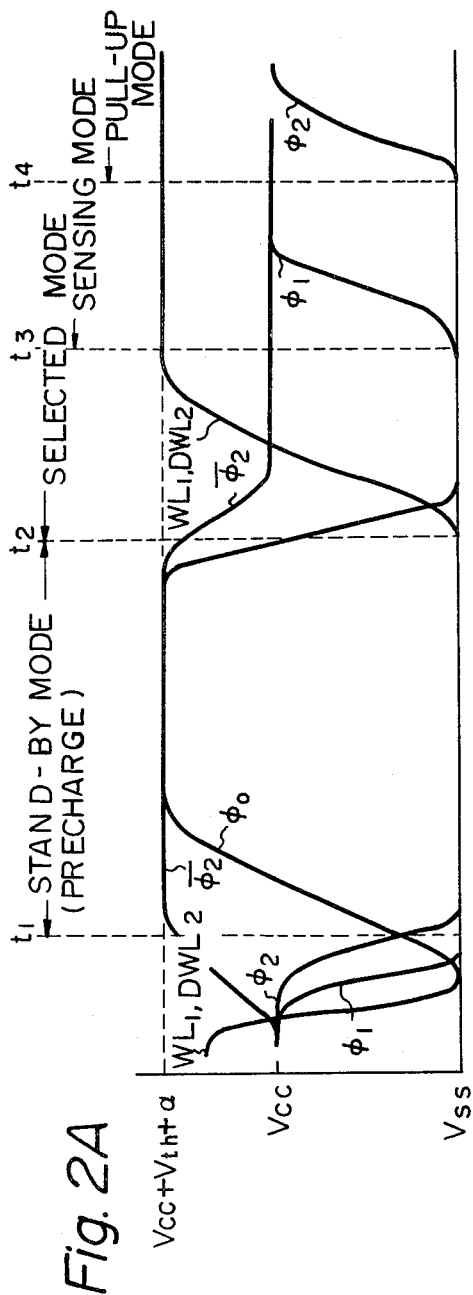
FIGS. 2A and 2B are timing waveform diagrams of the signals appearing in the circuit of FIG. 1.
Figure 2B:
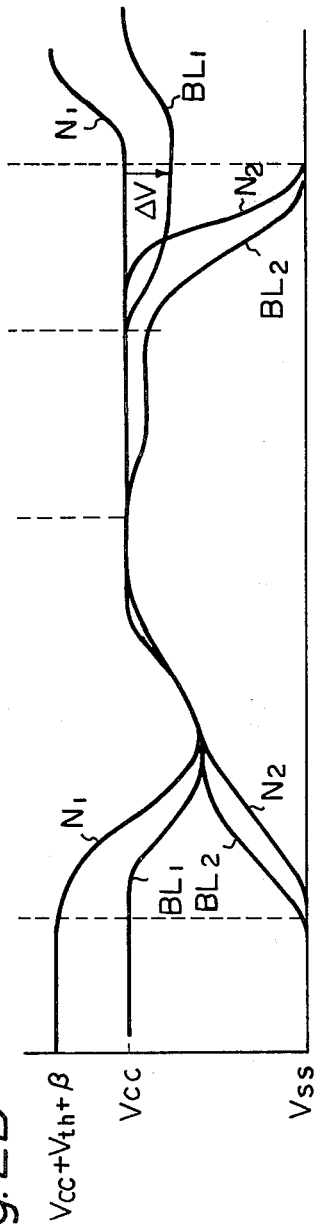

FIGS. 2A and 2B are timing waveform diagrams of the signals appearing in the circuit of FIG. 1. Referring to FIGS. 2A and 2B, the operation of the circuit of FIG. 1 will now be explained. First, at a time $t_1$ when the potential of the clock signal $\phi_0$ is changed from $V_{ss}$ to $V_{cc}+V_{th}+\alpha$, the transistors $Q_4$, $Q_7$, $Q_7'$, $Q_8$ and $Q_8'$ are turned on. As a result, the bit lines $BL_1$ and $BL_2$ are precharged up to $V_{cc}$, and the capacitors $C_2$ and $C_2'$ of the dummy memory cells $DMC_1$ and $DMC_2$ are discharged. It should be noted that, since the potential of the clock signal $\overline{\phi}_2$ is also $V_{cc}+V_{th}+\alpha$, the potentials at the nodes $N_1$ and $N_2$ become the same as those of the bit lines $BL_1$ and $BL_2$, respectively, that is, $V_{cc}$. This is called a stand-by mode or a precharge mode.

Next, at a time $t_2$, the potential of the clock signal $\phi_0$ is changed from $V_{cc}+V_{th}+\alpha$ to $V_{ss}$ so as to complete the precharge operation. Simultaneously, the potential of the clock signal $\overline{\phi}_2$ is also changed from $V_{cc}+V_{th}+\alpha$ to $V_{cc}$, so that the transistors $Q_{10}$ and $Q_{10}'$ are turned off.

In addition, at the time $t_2$, the potentials of the word line $WL_1$ and the dummy word line $DWL_2$, which is located on an opposite side of the word line $WL_1$ with regard to the sense amplifier SA, are changed from $V_{ss}$ to $V_{cc}+V_{th}+\alpha$, so that the operation enters into a selected mode. As a result, the selected memory cell $MC_1$ and the dummy memory $DMC_2$ are connected to the bit lines $BL_1$ and $BL_2$, respectively, so that the potentials of the bit lines $BL_1$ and $BL_2$ are changed. However, if the capacitor $C_1$ is charged in advance, the potentials of the bit line $BL_1$ remains at $V_{cc}$ as indicated by FIG. 2B. In contrast, the potential of the bit line $BL_2$ is reduced due to the presence of the discharged capacitor $C_2'$. Therefore, a small difference in potential between the bit lines $BL_1$ and $BL_2$ is generated.

Next, at a time $t_3$ when the potential of the clock signal $\phi_1$ is changed from $V_{ss}$ to $V_{cc}$, the operation enters into a sensing mode. That is, the transistor $Q_3$ is turned on so as to cause the sense amplifier SA to be operated. In this case, the transistor $Q_2$ is turned on so as to pull the potential of the bit line $BL_2$ down to $V_{ss}$. At this time, since the transistor $Q_1$ is turned off, the potential of the bit line $BL_1$ seems to remain at $V_{cc}$; however, actually, the potential of the bit line $BL_1$ is reduced slightly due to the capacity coupling of the bit line $BL_1$, leakage currents and the like. Such potential reduction is indicated by $\Delta V$ in FIG. 2B.

It should be noted that, if the potential reduction $\Delta V$ generated on the high-level bit line $BL_1$ is large, the difference in potential between the bit lines $BL_1$ and $BL_2$ becomes so small as to deteriorate the read operation. To avoid such a potential reduction, the potential of the high-level bit line $BL_2$ is again pulled up to $V_{cc}$ by the active pull-up circuit $APU_1$.

That is, at a time $t_4$, the potential of the clock signal $\phi_2$ is changed from $V_{ss}$ to $V_{cc}$, so that the operation enters into a pull-up mode. In the active pull-up circuit $APU_1$, since the source-gate voltage $\Delta V$ of the transistor $Q_{10}$ is smaller than the threshold voltage $V_{th}$, the transistor $Q_{10}$ remains in an off-state, so that the capacity coupling of the capacitor $C_3$ boosts the potential at the node $N_1$, as illustrated in FIG. 2B, so as to ensure that the transistor $Q_9$ is turned on. Therefore, the bit line $BL_1$ is again charged by the current flowing through the transistor $Q_9$ so that the potential of the bit line $BL_1$ is returned to $V_{cc}$, as illustrated in FIG. 2B. On the other hand, in the active pull-up circuit $APU_2$, since the source-gate voltage of the transistor $Q_{10}'$ is larger than the threshold voltage $V_{th}$, the transistor $Q_{10}'$ is turned on. In addition, the transistor $Q_2$ is also turned on. As a result, even when the potential at the node $N_2$ is pulled up by the capacity coupling of the capacitor $C_3'$, a current flows through the transistor $Q_{10}'$, the bit line $BL_2$, the transistor $Q_2$ and the transistor $Q_3$. That is, the capacity coupling of the capacitor $C_3'$ does not boost the potential at the node $N_2$. Therefore, the transistor $Q_9'$ does not conduct and accordingly, the bit line $BL_2$ is not charged.

Thus, at the end of the pull-up mode operation, the difference in potential between the bit lines $BL_1$ and $BL_2$ is $V_{cc} - V_{ss}$, which is helpful for the read operation.

However, in the active pull-up circuit $APU_1$ or $APU_2$ of FIG. 1, there is a fatal disadvantage in that the clock signal $\overline{\phi}_2$, having a potential level which is larger than the power supply voltage $V_{cc}$, requires another power supply or a bootstrap circuit for generating such high potential.

Figure 3:
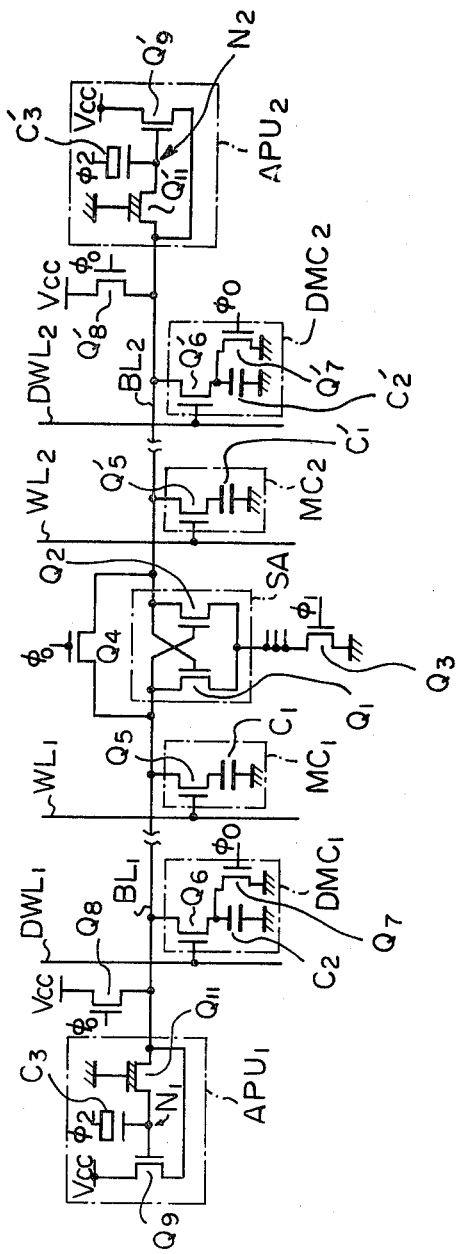
FIG. 3 is a circuit diagram illustrating another conventional dynamic memory device including active pull-up circuits.

FIG. 3 is a circuit diagram illustrating another conventional dynamic memory device including active pull-up circuits (Ref.: the above-mentioned Digest of Technical Papers of 1979 IEEE International Solid-State Circuits Conference). In FIG. 3, the elements which are the same as those of FIG. 1 are denoted by the same references. That is, in FIG. 3, instead of the enhancement type transistors $Q_{10}$ and $Q_{10}'$ of FIG. 1, depletion type transistors $Q_{11}$ and $Q_{11}'$, each having a gate connected to ground ($V_{ss}$) are provided. Therefore, the active pull-up circuit of FIG. 3 has an advantage in that the above-mentioned clock signal $\overline{\phi}_2$ having a high potential level is unnecessary.

FIGS. 4A and 4B are timing waveform diagrams of the signals appearing in the circuit of FIG. 3. Referring to FIGS. 4A and 4B, the operation of the circuit of FIG. 3 will now be explained.

During the stand-by (precharge) mode between the times $t_1$ and $t_2$, since the potential of the clock signal $\phi_0$ is $V_{cc} + V_{th} + \alpha$, the transistors $Q_4$, $Q_7$, $Q_7'$, $Q_8$ and $Q_8'$ are turned on, so that the bit lines $BL_1$ and $BL_2$ are precharged to $V_{cc}$ and the capacitors $C_2$ and $C_2'$ are discharged. However, it should be noted that, in this case, the potentials at the nodes $N_1$ and $N_2$ are $-V_{th}(d)$, where $V_{th}(d)$ is a negative threshold voltage of the depletion type transistors $Q_{11}$ and $Q_{11}'$.

During the selected mode between the times $t_2$ and $t_3$, the operation of FIG. 3 is similar to that of FIG. 1. However, the potentials at the nodes $N_1$ and $N_2$ remain at $-V_{th}(d)$. In addition, during the sensing mode between the times $t_3$ and $t_4$, the operation of FIG. 3 is also similar to that of FIG. 1.

During the pull-up mode after the time $t_4$, the potential of the clock signal $\phi_2$ is changed from $V_{ss}$ to $V_{cc}$. At this time, in the active pull-up circuit $APU_1$, even when the transistor $Q_{11}$ is of the depletion type, the transistor $Q_{11}$ remains in an off-state due to the fact that the potential of the bit line $BL_1$ is so high that the source-gate voltage of the transistor $Q_{11}$ is lower than the negative threshold voltage $V_{th}(d)$. Therefore, the capacity coupling by the capacitor $C_3$ boosts the potential at the node $N_1$, as illustrated in FIG. 4B, so as to ensure that the transistor $Q_9$ is turned on. Therefore, the bit line $BL_1$ is again charged to $V_{cc}$ by the current flowing through the transistor $Q_9$. On the other hand, in the active pull-up circuit $APU_2$, since the potential of the bit line $BL_2$ is low ($=V_{ss}$), the source-gate voltage of the depletion type transistor $Q_{11}'$ is not so negative as to turn off the transistor $Q_{11}'$. That is, the transistor $Q_{11}'$ is turned on. In addition, the transistor $Q_2$ is also turned on. As a result, even when the potential at the node $N_2$ is pulled up by the capacity coupling of the capacitor $C_3'$, a current flows through the transistor $Q_{11}'$, the bit line $BL_2$, the transistor $Q_2$ and the transistor $Q_3$. That is, the capacity coupling of the capacitor $C_3'$ does not boost the potential at the node $N_2$. Therefore, the transistor $Q_9'$ does not conduct and accordingly, the bit line $BL_2$ is not charged.

However, the above-mentioned active pull-up circuits $APU_1$ and $APU_2$ of FIG. 3 have a disadvantage in that a selection range for the negative threshold voltage $V_{th}(d)$ is small, due to the fact that the potential of the gates of the depletion type transistors is fixed at $V_{ss}$.

That is, since the gate potential of the depletion type transistor $Q_{11}$ is $V_{ss}$ (0 volt), the node $N_1$ is charged up to $|V_{th}(d)|$ at most. ($V_{th}(d)$ is, for example, $-3$ volts.) It should be noted that it is necessary for the potential at the node $N_1$ to be higher than $V_{cc} + V_{th}$ prior to the pull-up mode, in order to pull up the potential of the high-level bit line, which, in this case is $BL_1$, to $V_{cc}$. In this case, the following should be satisfied:

$$V_{cc} + V_{th} + \alpha \leq |V_{th}(d)| + V_{cc} \times k$$

where $|V_{th}(d)|$ is the precharge potential of the high-level bit line $BL_1$;

$V_{cc} \times k$: the increase in potential of the high-level bit line $BL_1$ due to the bootstrap effect by the clock signal $\phi_2$; and k: a constant in consideration of an overdrive quantity, which is represented by $C_L/(C_L+C_3)$ where $C_L$ is the load capacity (the gate capacity of the transistor $Q_9$, the junction capacities of the capacitor $C_3$ and the transistor $Q_{11}$ and so on) of the node $N_1$, and $C_3$ represents the capacity of the capacitor $C_3$. Therefore, it is preferable for the value $|V_{th}(d)|$ to be as large as possible so as to precharge the high-level bit line to a higher level.

On the other hand, prior to the pull-up mode, if the potential of the bit line $BL_1$ is lower than $|V_{th}(d)|$, the charges at the node $N_1$ are discharged through the transistor $Q_{11}$, so that the potential at the node $N_1$ falls. At worst, even when the potential of the clock signal $\phi_2$ is raised during the pull-up mode, the transistor $Q_9$ can not conduct and, accordingly, the pull-up operation for the high-level bit line cannot be performed. To avoid this, it is necessary that $|V_{th}(d)| \leq V_{BL1}$ where $V_{BL1}$ is the potential of the high-level bit line $BL_1$ prior to the pull-up mode. This requires that the value $|V_{th}(d)|$ be as small as possible, however, this contradicts the above requirement.

Thus, the value $|V_{th}(d)|$ should be determined in consideration of the above, and accordingly, the selection range for the value $|V_{th}(d)|$ is small. Actually, the value $V_{th}(d)$ is, for example, $-3$ volts.

The above-mentioned limitation on the value $|V_{th}(d)|$ seems to be compensated for by enhancing the bootstrap effect during the pull-up mode. However, in order to enhance the bootstrap effect, it is necessary to increase the capacity of the capacitor $C_3(C_3')$ as a MOS capacitor, or to increase the amplitude of the clock signal $\phi_2$. However, it is not easy to increase the capacity of a MOS capacitor and, in addition, it is disadvantageous to enhance the potential of the clock signal $\phi_2$ to be higher than $V_{cc}$, since the number of power supplies becomes large.

Figure 5:
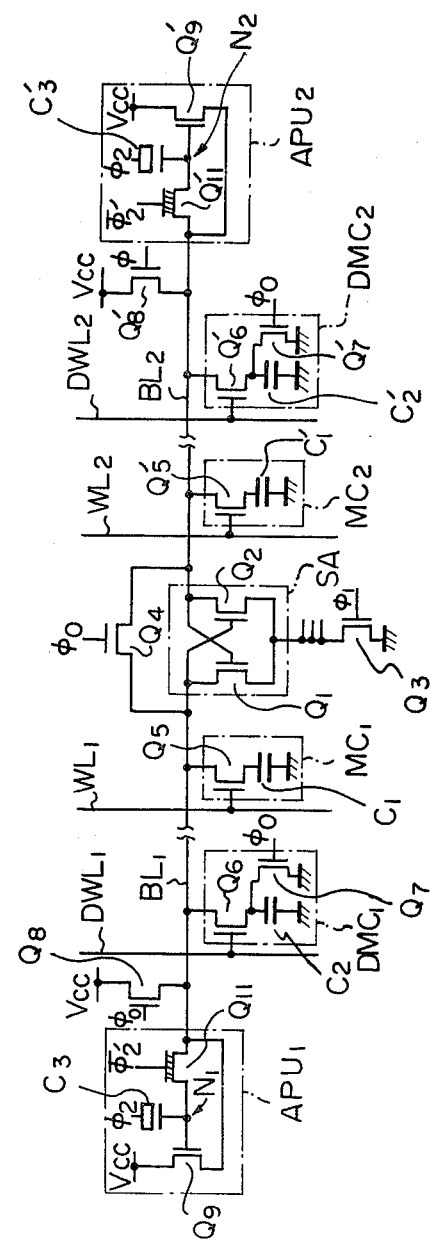
FIG. 5 is a circuit diagram illustrating an embodiment of the dynamic memory device including active pull-up circuits according to the present invention.

FIG. 5 is a circuit diagram illustrating an embodiment of the dynamic memory device including active pull-up circuits according to the present invention. In FIG. 5, the elements which are the same as those of FIG. 3 are denoted by the same references. In FIG. 5, the depletion type transistors $Q_{11}$ and $Q_{11}'$ are controlled by a clock signal $\overline{\phi_2}'$, which is different from FIG. 3. During the stand-by mode, the potential of the clock signal $\overline{\phi_2}'$ is high (third potential level) so as to turn on the depletion type transistors $Q_{11}$ and $Q_{11}'$ and, accordingly, to charge the nodes $N_1$ and $N_2$ to $V_{cc}$. On the other hand, during the pull-up mode, the potential of the clock signal $\overline{\phi_2}$ is low (fourth potential level) so as to turn on the depletion type transistor on the low-level bit line and turn off the depletion type transistor on the high-level bit line, even when the potential of the high-level bit line is considerably reduced. Thus, the potential of the clock signal $\overline{\phi_2}'$ is $V_{cc}$ (first potential level) and $V_{ss}$ (second potential level) during the stand-by mode and the pull-up mode, respectively.

Figure 6:
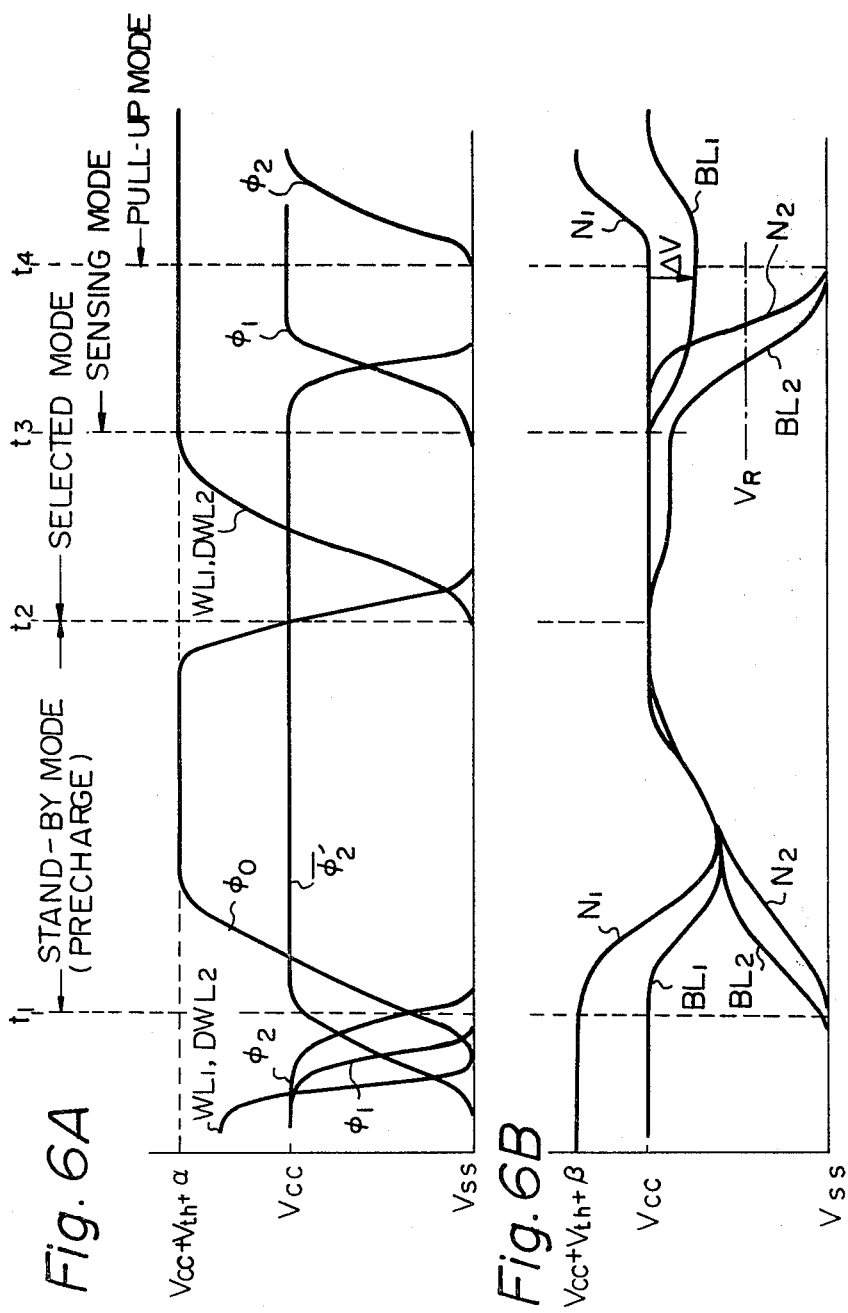
FIGS. 6A and 6B are timing waveform diagrams of the signals appearing in the circuit of FIG. 5.

FIGS. 6A and 6B are timing waveform diagrams of the signals appearing in the circuit of FIG. 5. Referring to FIGS. 6A and 6B, the operation of the circuit of FIG. 5 will now be explained.

During the stand-by mode between the times $t_1$ and $t_2$, the potentials at the nodes $N_1$ and $N_2$ are also the same as those of the bit lines $BL_1$ and $BL_2$, respectively, that is, $V_{cc}$.

During the selected mode between the times $t_2$ and $t_3$ and during the sensing mode, the operation of FIG. 5 is similar to that of FIG. 3. However, note that the potential at the node $N_1$ which is located on the high-level bit line $BL_1$ remains at $V_{cc}$.

During the pull-up mode, in the active pull-up circuit $APU_1$, it is easy to pull up the potential at the node $N_1$ to be higher than $V_{cc}+V_{th}$, since the potential at the node $N_1$ is already $V_{cc}$ prior to the pull-up mode. In addition, note that the increase of the potential of the node $N_1$ due to the bootstrap effect is small, so that the capacity of the capacitor $C_3 (C_3')$ is small as compared with FIG. 3.

Thus, the limitation of a selection range for the value $|V_{th}(d)|$, required by the device of FIG. 3, does not exist. Accordingly, a reference voltage $V_R$, for determining whether the potential of the bit lines $BL_1$ and $BL_2$ is high or low, can be freely selected by the common negative threshold voltage of the transistors $Q_{11}$ and $Q_{11}'$. In this case, $V_R$ is equal to $|V_{th}(d)|$.

Figure 7:
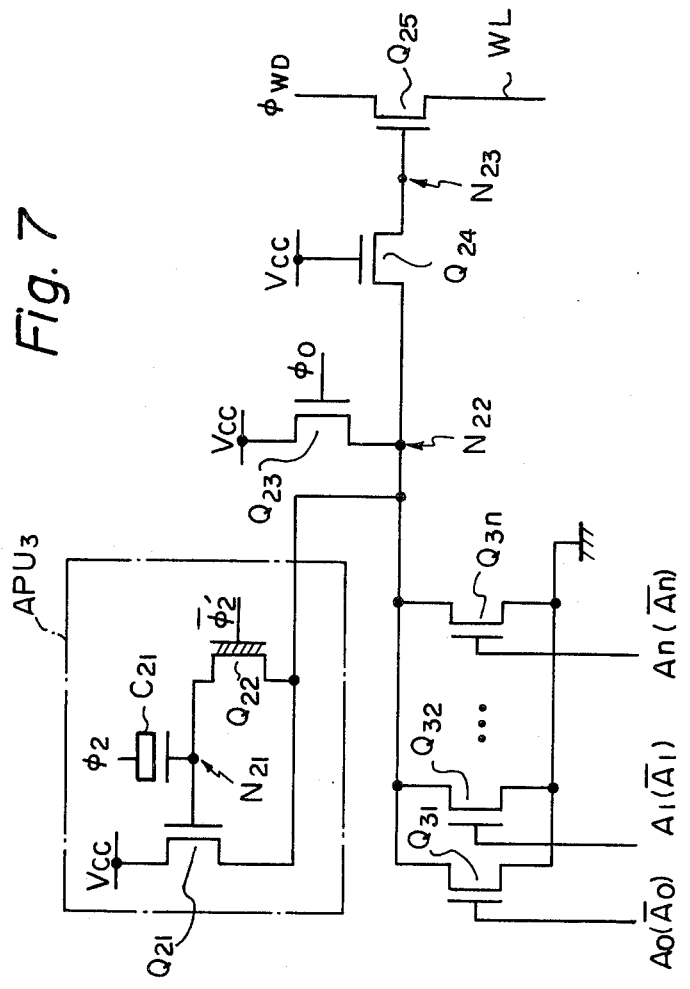
FIG. 7 is a circuit diagram illustrating another embodiment of the word decoder including an active pull-up circuit according to the present invention.

FIG. 7 is a circuit diagram illustrating another embodiment of the word decoder including an active pull-up circuit according to the present invention. In FIG. 7, the elements of an active pull-up circuit $APU_3$ are the same as those of the active pull-up circuits $APU_1$ or $APU_2$ of FIG. 5. A transistor $Q_{23}$ is used for precharging a node $N_{22}$ during the stand-by mode, while a transistor $Q_{24}$ is a transfer gate. A transistor $Q_{25}$ serves as a word driver which uses a word driver clock signal $\phi_{WD}$ so as to drive a word line WL. In addition, transistors $Q_{31}, Q_{32}, \ldots, Q_{3n}$ are used for decoding address signals $A_0$ (or $\overline{A}_0$), $A_1$ (or $\overline{A}_1$), $\ldots$, $A_n$ (or $\overline{A}_n$). That is, for example, the gate of the transistor $Q_{31}$ receives one of the signals $A_0$ and $\overline{A}_0$. Similarly, the gate of the transistor $Q_{32}$ receives one of the signals $A_1$ and $\overline{A}_1$. The operation of the circuit of FIG. 7 will now be explained.

FIGS. 8A and 8B are timing waveform diagrams of the signals appearing in the circuit of FIG. 7, in the case where the word line WL is selected. Referring to FIGS. 8A and 8B, at a time $t_1'$, the potential of the clock signal $\phi_0$ is changed from $V_{ss}$ to $V_{cc}+V_{th}+\alpha$ and in addition, the potential of the clock signal $\overline{\phi_2}'$ is changed from $V_{ss}$ to $V_{cc}$ (from the fourth potential level to the third potential level), as illustrated in FIG. 8A. As a result, nodes $N_{21}, N_{22}$ and $N_{23}$ are precharged to $V_{cc}$. In this case, the potentials at the nodes $N_{21}$ and $N_{22}$ are $V_{cc}$, while the potential at the node $N_{23}$ is $V_{cc}-V_{th}$ due to the fact that the gate of the enhancement type transistor $Q_{24}$ receives $V_{cc}$, as illustrated in FIG. 8B.

Next, at a time $t_2'$, the potential of the clock signal $\phi_0$ falls to $V_{ss}$, so that the nodes $N_{21}, N_{22}$ and $N_{23}$ enter a floating state. When the word line WL is selected, the potentials of the address signals $A_0$ (or $\overline{A}_0$), $A_1$ (or $\overline{A}_1$), $\ldots$, $A_n$ (or $\overline{A}_n$) are essentially $V_{ss}$; however, actually, the potentials of such address signals rise for a short period, as illustrated in FIG. 8A, due to the operation of address buffers (not shown). As a result, the transistors $Q_{31}, Q_{32}, \ldots, Q_{3n}$ are also turned on, so that the potential at the node $N_{22}$ is a little reduced as illustrated in FIG. 8B. Such potential reduction is compensated for by the active pull-up circuit $APU_3$.

That is, at a time $t_3'$, the potential of the clock signal $\phi_2$ rises up to the first potential level, so that the capacity coupling of the capacitor $C_{21}$ boosts the node $N_{21}$ and accordingly, the transistor $Q_{21}$ conducts. As a result, the potential at the node $N_{22}$ is returned to $V_{cc}$ and after that, the potential at the node $N_{23}$ rises. Therefore, the transistor $Q_{25}$ causes the word line WL to be high by inputting the clock signal $\phi_{WD}$.

Figures 9A, 9B:
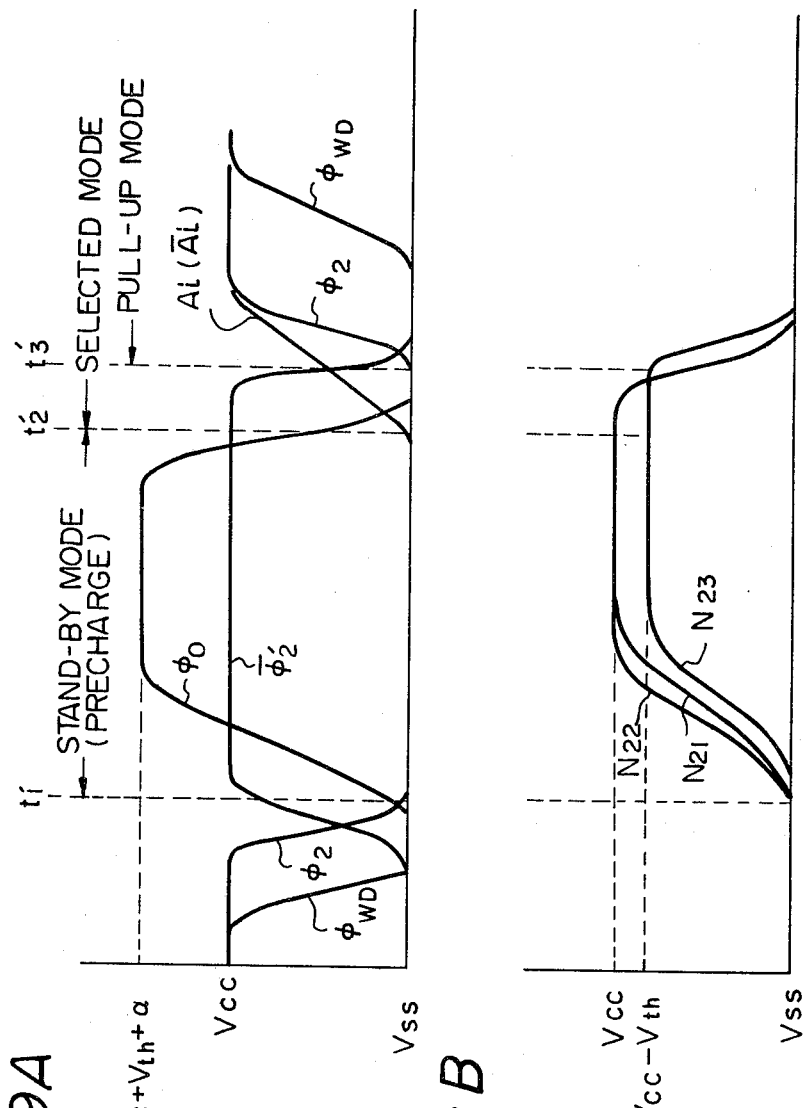

FIGS. 9A and 9B are also timing waveform diagrams of the signals appearing in the circuit of FIG. 7, in the case where the word line WL is not selected. At the end of the stand-by mode operation, the potentials at the nodes $N_{21}$ and $N_{22}$ are $V_{cc}$, while the potential at the node $N_{23}$ is $V_{cc}-V_{th}$. Next, at the time $t_2'$, at least one of $A_0$ (or $\overline{A}_0$), $A_1$ (or $\overline{A}_1$), ..., $A_n$ (or $\overline{A}_n$) is changed from $V_{ss}$ to $V_{cc}$, so that the potential at the node $N_{22}$ falls to $V_{ss}$ and accordingly, the potentials at the nodes $N_{21}$ and $N_{23}$ also fall to $V_{ss}$. Therefore, at the time $t_3'$, even when the potential of the clock signal $\phi_2$ rises, the capacity coupling of the capacitor $C_{21}$ does not boost the node $N_{21}$ and, accordingly, the transistor $Q_{21}$ remains nonconductive.

As explained hereinbefore, the active pull-up circuit according to the present invention has an advantage, as compared with the conventional circuit of FIG. 3, in that the negative threshold voltage of the depletion type transistor is freely selected. In addition, a dynamic (active) pull-up operation can be performed easily without increasing the capacity of the MOS capacitors used in the active pull-up circuits and without increasing the amplitude of the clock signal for driving the above-mentioned MOS capacitors.

We claim:

1. An active pull-up circuit having a stand-by mode and a pull-up mode, comprising:
   first and second power supplies, the potential of said first power supply being higher than that of said second power supply;
   an output line;
   first means for generating a first clock signal having a potential which is of a second potential level during the stand-by mode, and which is of a first potential level, higher than said second potential level, during the pull-up mode;
   second means for generating a second clock signal having a potential which is of a third potential level during the stand-by mode, and which is of a fourth potential level, lower than said third potential level, during the pull-up mode;
   means, connected to said first power supply and said output line, for pulling-up the potential of said output line;
   means, connected to said first means and said pulling-up means, for supplying said first clock signal to said pulling-up means; and
   a depletion type MIS transistor having a drain connected to said pulling-up means and said first clock signal supplying means, having a source connected to said output line and a gate connected to said second means.

2. A circuit as set forth in claim 1, wherein said pulling-up means comprises an enhancement type MIS transistor having a drain connected to said first power supply, having a source connected to said output line, and having a gate connected to said clock signal supplying means.

3. A circuit as set forth in claim 1, wherein said first clock signal supplying means comprises a capacitor having a first electrode connected to said first means and a second electrode connected to said pulling-up means.

4. A circuit as set forth in claim 1, wherein said first potential level and said third potential level are the same as that of said first power supply, while said second potential level and said fourth potential level are the same as that of said second power supply.

5. A dynamic memory device having a stand-by mode and a pull-up mode, comprising:
   first and second power supplies, the potential of said first power supply being higher than that of said second power supply;
   first clock signal generating means for generating a first clock signal having a potential which is high during the stand-by mode;
   second clock signal generating means for generating a second clock signal having a potential which is of a second potential level during the stand-by mode, and which is of a first potential level, higher than said second potential level, during the pull-up mode;
   third clock signal generating means for generating a third clock signal having a potential which is of a third potential level during the stand-by mode, and which is of a fourth potential level, lower than said third potential level, during the pull-up mode;
   a plurality of word lines;
   a plurality of pairs of bit lines;
   a plurality of memory cells, arranged at intersections between said word lines and said bit lines;
   a plurality of precharging means, each connected to said first power supply, to said first clock signal generating means and to one of said bit lines, for precharging said bit lines;
   a plurality of sense amplifiers, each connected between one of said plurality of pairs of said bit lines, for sensing the differences in potential between the one pair of said bit lines during the sensing mode;
   a plurality of active pull-up circuits, each connected to said first power supply, to said second and third clock signal generating means and to one of said bit lines, for pulling up the potentials of said bit lines, each of said active pull-up circuits comprising:
      pulling-up means, connected to said first power supply and one of said bit lines, for pulling up the potential of the bit line;
      clock signal supplying means, connected to said second clock signal generating means and said pulling-up means, for supplying said second clock signal to said pulling-up means; and
      a depletion type MIS transistor having a drain connected to said pulling-up means and said second clock signal supplying means, having a source connected to one of said bit lines, and having a gate connected to said third clock signal generating means.

6. A device as set forth in claim 5, wherein said pulling-up means comprises an enhancement type MIS transistor having a drain connected to said first power supply, having a source connected to one of said bit lines, and having a gate connected to said second clock signal supplying means.

7. A device as set forth in claim 5, wherein said second clock signal supplying means comprises a capacitor having a first electrode connected to said second clock signal generating means and having a second electrode connected to said pulling-up means.

8. A device as set forth in claim 5, wherein said first potential level and said third potential level are the same as that of said first power supply, while said second potential level and said fourth potential level are the same as that of said second power supply.

9. A device as set forth in claim 5, wherein the potential of said first clock signal is higher than that of said first power supply during the stand-by mode.

10. A device as set forth in claim 5, wherein said memory cells are of a one-transistor and one-capacitor type.

* * * * *

UNITED STATES PATENT AND TRADEMARK OFFICE
CERTIFICATE OF CORRECTION

PATENT NO. : 4,417,329
DATED : NOVEMBER 22, 1983
INVENTOR(S) : TSUTOMU MEZAWA ET AL.

It is certified that error appears in the above-identified patent and that said Letters Patent is hereby corrected as shown below:

Col. 4, line 10, delete "a";
      line 19, "$APU_{21}$" should be --$APU_2$--;
      line 67, "potentials" should be --potential--.
Col. 5, line 54, "larger" should be --higher--.
Col. 10, line 27, "differences" should be --difference--.

Signed and Sealed this

Seventeenth Day of April 1984

[SEAL]

Attest:

GERALD J. MOSSINGHOFF

Attesting Officer     Commissioner of Patents and Trademarks